United States Patent [19]
Borland

[11] Patent Number: 5,831,436
[45] Date of Patent: *Nov. 3, 1998

[54] INTRAVEHICULAR AUTO HARNESS INTEGRITY TESTER

[76] Inventor: Leslie R. Borland, Six Signal Hill Rd., Lake Placid, N.Y. 12946

[21] Appl. No.: 892,317

[22] Filed: Jul. 14, 1997

[ * ] Notice: The term of this patent shall not extend beyond the expiration date of Pat. No. 5,635,843.

[51] Int. Cl.[6] .................................................. G01R 31/02
[52] U.S. Cl. ......................... 324/503; 324/504; 324/556; 324/133
[58] Field of Search ................................... 324/503, 504, 324/505, 508, 555, 556, 133, 66

[56] References Cited

U.S. PATENT DOCUMENTS

| | | | |
|---|---|---|---|
| 3,566,401 | 2/1971 | Smith et al. ............................... | 324/503 |
| 4,166,242 | 8/1979 | Spiteri ...................................... | 324/133 |
| 4,689,551 | 8/1987 | Ryan et al. ................................ | 324/66 |
| 5,095,276 | 3/1992 | Nepil ........................................ | 324/504 |
| 5,208,543 | 5/1993 | Albiniak .................................... | 324/556 |
| 5,604,439 | 2/1997 | Wallkington et al. .................... | 324/504 |
| 5,635,843 | 6/1997 | Borland .................................... | 324/504 |

*Primary Examiner*—Diep N. Do
*Attorney, Agent, or Firm*—John J. Welch, Jr. Esq.

[57] ABSTRACT

An intravehicular auto harness tester consisting of a first housing unit mountable within or upon the dashboard of a motor vehicle containing three small light emitting diodes with wiring one wire per diode leading thereto and then therefrom and ultimately as one wire to ground, coupled with one resistor per diode, with such wiring entering the housing unit and leaving it by way of a coaxial cable leading to a second housing unit located typically in the trunk of the vehicle with the wiring within the coaxial cable being connected within the second housing unit to each of three prongs one wire per prong and with one wire to ground via a female socket pocket all located at a front end of the second housing unit for purposes of interfacing with an intravehicular auto harness power plug.

24 Claims, 4 Drawing Sheets

INTRAVEHICULAR AUTO HARNESS INTEGRITY TESTER

BACKGROUND OF THE INVENTION

1. Field of the Invention

The instant invention relates to that class of devices that serve to test conductivity of wiring in vehicles where such wiring via a harness unit, so-called ultimately connects a power source within such vehicles to the rear lights on trailer vehicles amenable to being towed by such vehicles.

2. Prior Art

The following references are to be found within the particular field of the instant invention, but he claims and specifications set forth therein do not anticipate those that are endemic to the instant invention:

| Inventor | Invention | Patent No. | Date |
| --- | --- | --- | --- |
| Whisenand | Electrical Tester with Electrical Energizable Test Probe | 5,267,250 | 11/22/94 |
| Jeter | Trailer Light Converter | 4,781,393 | 11/1/88 |
| Schneider, III | Compact Lamp and Circuit Tester for Vehicles, Particularly Automobiles | 5,278,511 | 1/11/94 |
| Lieu et al. | Portable Apparatus for Testing Multi-Harness and Electrical Assemblies to Identify Wiring Errors | 5,250,907 | 10/5/93 |
| Lemon | Apparatus for Determining Wiring Orientation at Electrical Connectors Including Plural Light Indicators and Rotary Switch | 5,192,912 | 3/9/93 |
| McConchie Sr. | Diagnostic Test Apparatus Electrical System of Automotive Vehicle | 4,884,033 | 11/28/89 |
| Butchko | Vehicle Light Testing System for Testing a Plurality of Lights Using a Scanning Sequence | 4,866,390 | 9/12/89 |
| Borland | Auto Harness Integrity Tester | 5,635,843 | 6/3/97 |

SUMMARY OF THE INVENTION

1. A Brief Description of the Invention

The instant invention consists of a first housing unit that typically is mounted in, or about the dash of a motor vehicle or, alternatively on another surface within the ready view of the driver of such a vehicle when the driver is seated in the driver's seat of the vehicle. Within this housing unit there are three (3) small light emitting diodes therein held stationary and connected by three (3) wires emanating from each of three (3) resistor units. Each diode is likewise connected to a fourth ground wire. A second embodiment features connection of diodes to a ground wire via the resistors that are connected to ground. Each resistor has wiring connected thereto that, upon entry into or exit from the housing unit is along with the ground wiring housed within a coaxial cable unit. The second embodiment has wiring connecting directly to the diodes upon entry into the housing unit within the coaxial cable, and; wiring leading instead from each of the three (3) resistors to a ground wire. In respect of each embodiment, the cable and enclosed wiring runs through and within the vehicle from within a second housing unit located typically in the trunk of the vehicle. Within the second housing unit there is further wiring. The second housing unit has at one i.e., first end, a set of three identical male prongs and a female socket pocket. The first end of the second housing unit is meant to interface frontwise with a power plug emanating from an intravehicular power source with the power plug typically having three female socket pockets and one male prong. The four wires within the coaxial cable are, within the second housing unit connected one wire per prong to interior ends of the three identical male prongs thereof and the ground wire is connected to a metallic base of the female socket pocket thereof. These three identical male prongs interface with the three female socket pockets of a power plug portion of a typical auto harness and the female socket pocket interfaces with the male prong thereof. The ground wire within the second housing unit so connected to the metallic base of the female socket pocket on the front face of the second housing unit that interfaces with the male prong of the power plug portion of a typical auto harness serves to facilitate the flow of power to ground. A variant of each embodiment is one wherein each is equipped with a switch.

2. Objects of the Invention

It is inconvenient and time consuming to be required to walk behind a trailer vehicle being hauled by a motor vehicle to check to see if its rear running and, parking lights and then right rear braking and directional lights and left rear braking and directional lights are working and upon observing failure in either one or more these systems to then be required to ascertain via continuing walking around and inspecting whether such failure is due to failure within the vehicle or vehicle's power harness or within the bulbs or wiring of the trailer vehicle itself. Invariably, diagnosis in any such event requires an unhooking of the trailer vehicle from the vehicle and a rechecking of the above-mentioned systems within the vehicle itself. However, utilization of the instant invention will very quickly and expeditiously enable one to ascertain whether there are vehicle or harness problems with respect to such systems. Without ever leaving the vehicle, one can simply check to see if all three such systems on the vehicle or harness are working merely by viewing the diode components of the instant invention as the appropriate activation switches relating to each are turned on, then off. Once it is clear that all such systems are properly working, then, the appropriate activation switches can once again, be turned on one at a time to discern, via one walk around inspection only, operability or not of the corresponding lighting systems in the rear of the trailer vehicle.

Respectfully submitted, the instant invention whether installed by an auto manufacturer or subsequently retrofitted thereto by an owner of the motor vehicle is a very simple, uniquely inexpensive and convenient device that facilitates quick and ready diagnosis initially from within the vehicle itself of the actual source of any such rear light systems problem should there prove to be any and as such the instant invention constitutes a rather marked improvement over the current art regarding such devices.

A DESCRIPTION OF THE PREFERRED EMBODIMENT

Figure 1:
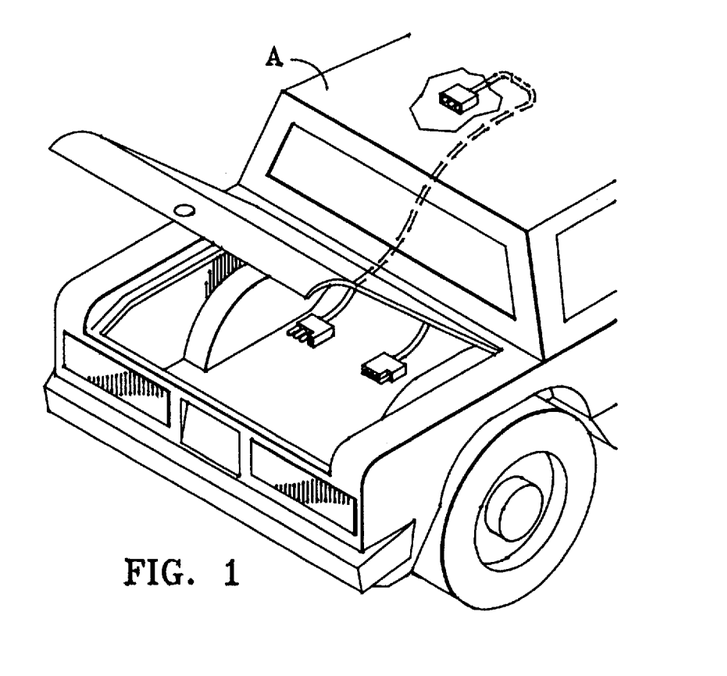
FIG. 1 shows a motor vehicle as well as showing the instant invention positioned within the motor vehicle.
Figure 2:
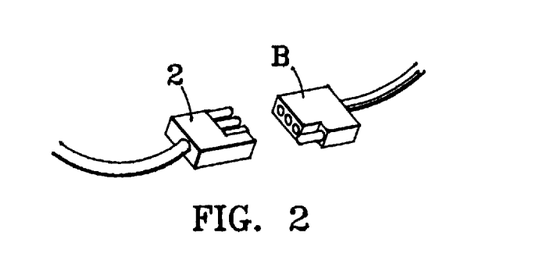
FIG. 2 is an isolated perspective view of the portion of the instant invention that interfaces with an automobile harness.
Figure 3:
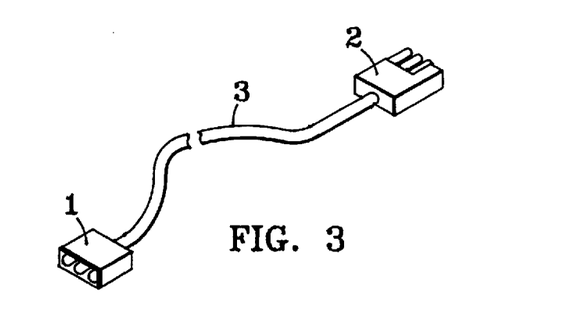
FIG. 3 is an isolated perspective view of the whole of the instant invention.
Figure 4:
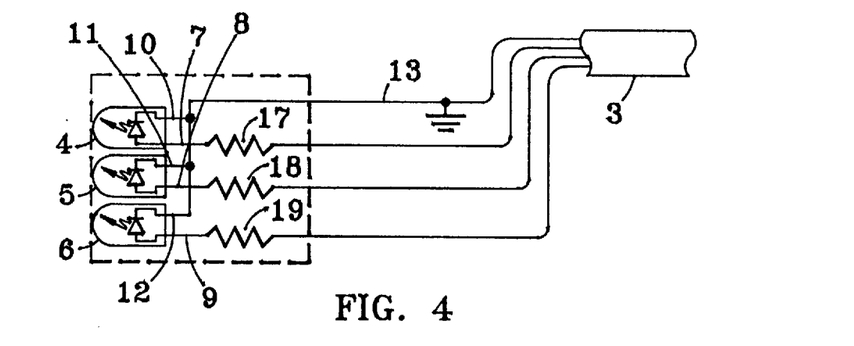
FIG. 4 is a schematic drawing of a portion of a first embodiment of the instant invention.
Figure 5:
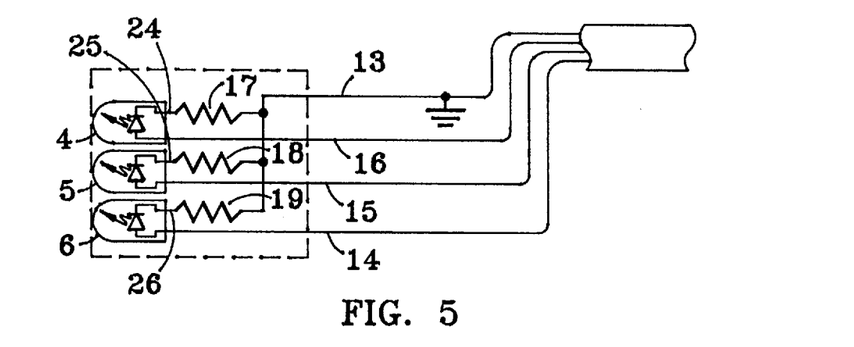
FIG. 5 is a schematic drawing of a portion of a second embodiment of the instant invention.
Figure 6:
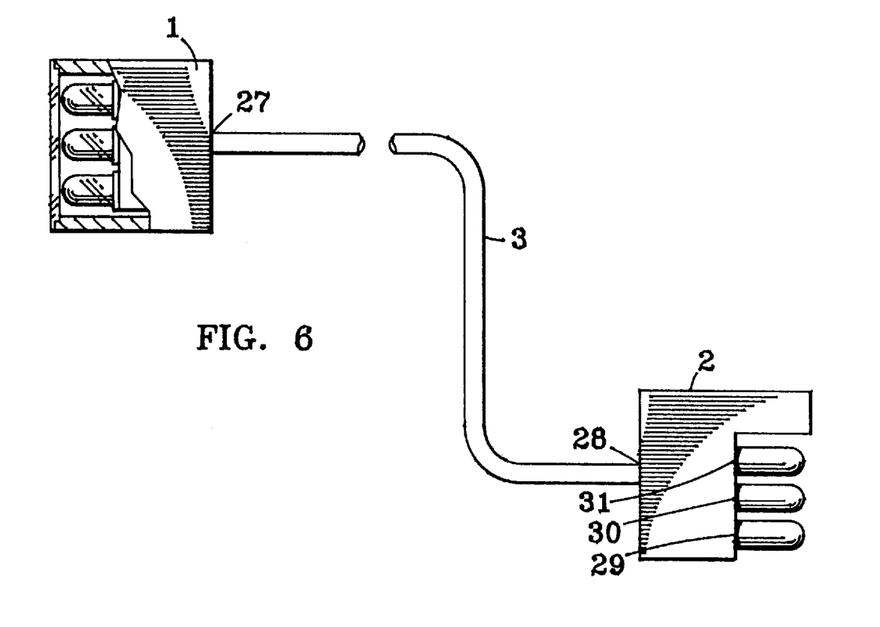
FIG. 6 is a broken plan view of the exterior portions of the instant invention.
Figure 7:
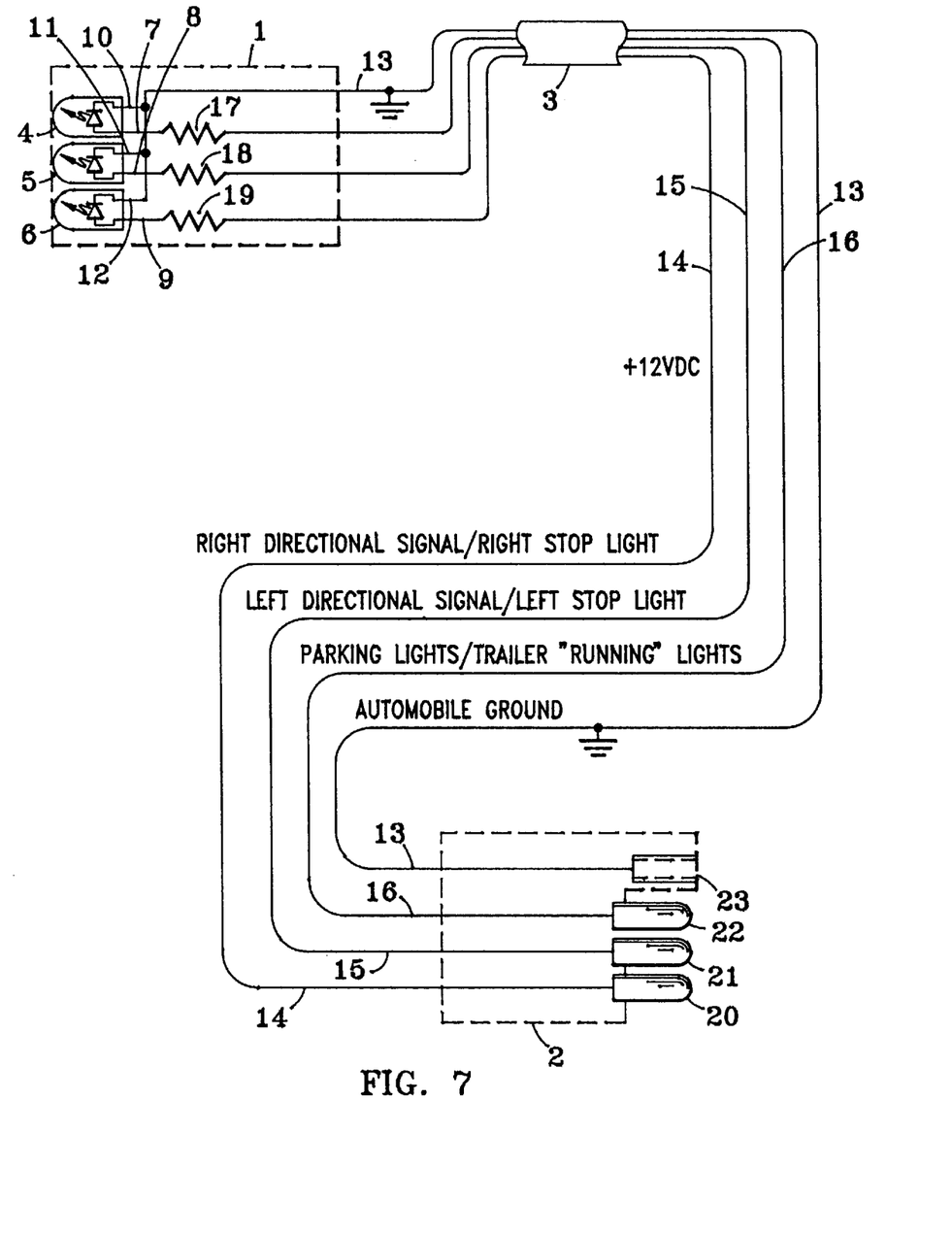
FIG. 7 is a schematic drawing of the whole of the first embodiment of the instant invention.
Figure 8:
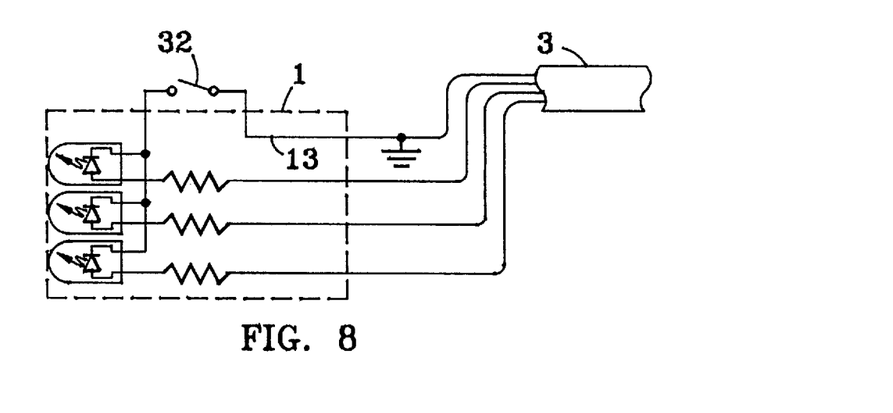
FIG. 8 is a schematic drawing of the embodiment shown in FIG. 4 equipped with a switch component.
Figure 9:
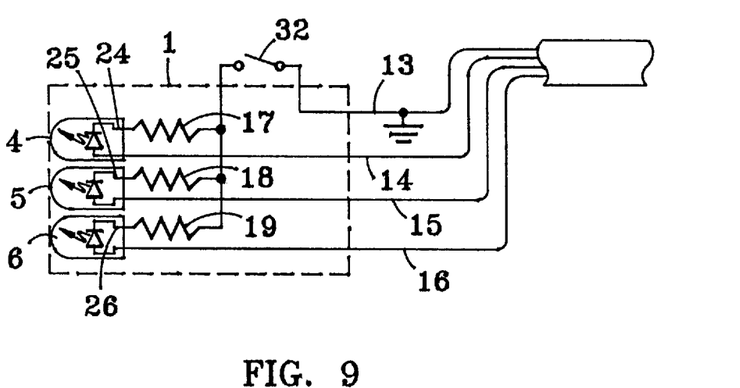
FIG. 9 is a schematic drawing of the embodiment shown in FIG. 5 equipped with a switch component.

FIG. 1 shows a motor vehicle A equipped with the instant invention. An auto harness B in apposition to a housing component 2 of the instant invention is also therein shown. FIG. 2 is an isolated perspective view of housing component 2 of the instant invention in apposition to the end of an auto harness B. FIG. 3 is an isolated perspective view of the whole of the instant invention. FIGS. 4 and 5 are schematic views of the contents of housing component 1 of each of two embodiments of the instant invention respectively. FIG. 6 is a broken plan view of the instant invention showing its housing component 1 and housing component 2 conjoined by coaxial cable 3. FIG. 7 is a schematic diagram the whole of the first embodiment of the instant invention. Resort to a viewing of FIG. 7 permits one to gain an appreciation for the manner in which the instant invention functions. Electric power from a power source within a motor vehicle A is transmitted via an auto harness B to each of three male prongs 20, 21 and 22 affixed at one end side of housing component 2 by way of being thereat mounted perforce of through holes 29, 30 and 31 respectively in this end side of housing component 2. Wires 14, 15 and 16 are affixed at interior ends respectively of prongs 20, 21 and 22 and serve to carry electric power received by the prongs by virtue of the interconnection of each of the prongs with female socket pockets within harness B. Wires 14, 15 and 16 exit housing component 2 via a cable through hole 28 located in one side of housing component 2 whereat coaxial cable 3 carrying wires 14, 15 and 16 is thereto connected. Power flows through wires 14, 15 and 16 within cable 3 to the location of a cable through hole 27 found in a side of housing component 1. Wires 14, 15 and 16 entering housing component I connect as respects a first embodiment of the instant invention, respectively therein to first ends of resistors 17, 18 and 19. Wires 7, 8 and 9 therein connect second ends of resistors 17, 18 and 19 to light emitting diodes 4, 5 and 6 affixed within housing component 1 at a second end side thereof that in one variant is transparent and closed and that in a second variant is open. Wires 10, 11 and 12 connect diodes 4, 5 and 6 respectively to a wire 13 also contained within cable 3. Power through diodes 4, 5 and 6 runs via wire 13 to ground by virtue of the connection of wire 13 to a metallic base of female socket pocket 23. Female socket pocket 23 connects with a male prong on auto harness B. A second embodiment of the instant invention, with either a closed, transparent or open second end side of a housing component 1 is characterized by wires 14, 15 and 16 connecting within housing component 1 directly to diodes 4, 5 and 6 respectively. Wires 24, 25 and 26 connect diodes 4, 5 and 6 respectively to respective first ends of resistors 17, 18 and 19. Respective second ends of resistors 17, 18 and 19 connect to wire 13. Power entering diodes 4, 5 and 6 directly via wires 14, 15 and 16, passes via wires 24, 25 and 26 respectively to resistors 17, 18 and 19 and therefrom to ground via wire 13 connected to a metallic base of female socket pocket 23 as described above with reference to the first embodiment of the invention. FIGS. 8 and 9 illustrate the manner in which each embodiment of the instant invention is amenable to being equipped with a switch 32. Switch 32, for example, a typical SPTS switch unit serves to control the flow of electric power to and ultimately from diodes 4, 5 and 6.

In conclusion, respectfully submitted, the instant device is indeed novel and unique whereas it permits the continuous testing during operation of a motor vehicle of the integrity of an automobile harness for purposes of transmitting power to the rear lighting of a trailer vehicle being towed by the automobile.

What is claimed is:

1. An intravehicular auto harness integrity tester, comprising:

a. a first housing component with a first cable through hole in one side thereof with an end side thereof being closed and transparent;

b. coaxial cable carrying within it, a first wire, a second wire, a third wire and a fourth wire;

c. said coaxial cable connected to said first housing component at the locus of said first cable through hole;

d. a second housing component with three identical front male prongs affixed thereto and originating respectively from each of three through holes at a front side thereof and a front female socket pocket originating from said front side thereof and with a second cable through hole within a second side thereof;

e. said coaxial cable being connected to said second housing component at-the locus of said second cable through hole;

f. said first wire being connected within said second housing component at an interior end of a first one of said three identical male prongs;

g. said second wire being connected within said second housing component at an interior end of a second one of said three identical male prongs;

h. said third wire being connected within said second housing component at an interior end of a third one of said three identical male prongs;

i. said first wire being also connected to a first resistor within said first housing component;

j. said second wire being also connected to a second resistor within said first housing component;

k. said third wire being also connected to a third resistor within said first housing component;

l. said first resistor being connected via a fifth wire connected to a first light emitting diode located within and internally affixed to said first housing component at said end side thereof being closed and transparent;

m. said second resistor being connected via a sixth wire connected to a second light emitting diode located within and internally affixed to said first housing component at said end side thereof being closed and transparent;

n. said third resistor being connected via an seventh wire connected to a third light emitting diode located within and internally affixed to said first housing component at said end side thereof being closed and transparent;

o. each of said diodes being connected within said first housing component to said fourth wire;

p. said fourth wire being connected within said second housing component to a metallic base of said front female socket pocket;

q. said resistors being all characterized by resistivity of 1.0 kilohms, and;

r. said light emitting diodes being all characterized by optoelectric current carrying capacity of 10 milliamps.

2. An intravehicular auto harness integrity tester, comprising:
  a. a first housing component with a first cable through hole in one side thereof with an end side thereof being open;
  b. coaxial cable carrying within it, a first wire, a second wire, a third wire and a fourth wire;
  c. said coaxial cable connected to said first housing component at the locus of said first cable through hole;
  d. a second housing component with three identical front male prongs affixed thereto and originating respectively from each of three through holes at a front side thereof and a front female socket pocket originating from said front side thereof and with a second cable through hole within a cable side thereof;
  e. said coaxial cable being connected to said second housing component at the locus of said second cable through hole;
  f. said first wire being connected within said second housing component at an interior end of a first one of said three identical male prongs;
  g. said second wire being connected within said second housing component at an interior end of a second one of said three identical male prongs;
  h. said third wire being connected within said second housing component at an interior end of a third one of said three identical male prongs;
  i. said first wire being also connected to a first resistor within said first housing component;
  j. said second wire being also connected to a second resistor within said first housing component;
  k. said third wire being also connected to a third resistor within said first housing component;
  l. said first resistor being connected via a fifth wire connected to a first light emitting diode located within and internally affixed to said first housing component at said end side thereof being open;
  m. said second resistor being connected via a sixth wire connected to a second light emitting diode located within and internally affixed to said first housing component at said end side thereof being open;
  n. said third resistor being connected via a seventh wire connected to a third light emitting diode located within and internally affixed to said first housing component at said end side thereof being open;
  o. each of said diodes being connected within said first housing component to said fourth wire;
  p. said fourth wire being connected within said second housing component to a metallic base of said front female socket pocket;
  q. said resistors being all characterized by resistivity of 1.0 kilohms, and;
  r. said light emitting diodes being all characterized by optoelectric current carrying capacity of 10 milliamps.

3. An intravehicular auto harness integrity tester, comprising:
  a. a first housing component with a first cable through hole in one end side thereof with an opposite end side thereof being closed and transparent;
  b. coaxial cable carrying within it, a first wire, a second wire, a third wire and a fourth wire;
  c. said coaxial cable connected to said first housing component at the locus of said first cable through hole;
  d. a second housing component with three identical front male prongs affixed thereto and originating respectively from each of three through holes at a front side thereof and a front female socket pocket originating from said front side thereof and with a second cable through hole within a second side thereof;
  e. said coaxial cable being connected to said second housing component at the locus of said second cable through hole;
  f. said first wire being connected within said second housing component at an interior end of a first one of said three identical male prongs;
  g. said second wire being connected within said second housing component at an interior end of a second one of said three identical male prongs;
  h. said third wire being connected within said second housing component at an interior end of a third one of said three identical male prongs;
  i. said first wire being also connected to a first one of three light emitting diodes located within and internally affixed to said first housing component at said end side thereof being closed and transparent;
  j. said second wire being also connected to a second one of said three light emitting diodes located within and internally affixed to said first housing component at said end side thereof being closed and transparent;
  k. said third wire being also connected to a third one of said three light emitting diodes located within and internally affixed to said first housing component at said end side thereof being closed and transparent;
  l. a fifth wire connecting said first one of said three light emitting diodes to one end of a first resistor within said first housing component;
  m. a sixth wire connecting said second one of said three light emitting diodes to one end of a second resistor within said first housing component;
  n. a seventh wire connecting said third one of said three light emitting diodes to one end of a third resistor within said first housing component;
  o. a second end of said first resistor and a second end of said second resistor and a second end of said third resistor being connected to said fourth wire within said first housing component;
  p. said fourth wire being further connected to a metallic base of said front female socket pocket within said second housing component;
  q. said resistors being all characterized by resistivity of 1.0 kilohms, and;
  r. said light emitting diodes being all characterized by optoelectric current carrying capacity of 10 milliamps.

4. An intravehicular auto harness integrity tester, comprising:
  a. a first housing component with a first cable through hole in one side thereof with an end side thereof being open;
  b. coaxial cable carrying within it, a first wire, a second wire, a third wire and a fourth wire;
  c. said coaxial cable connected to said first housing component at the locus of said first cable through hole;
  d. a second housing component with three identical front male prongs affixed thereto and originating respectively from each of three through holes at a front side thereof and a front female socket pocket originating from said front side thereof and with a second cable through hole within a second side thereof;

e. said coaxial cable being connected to said second housing component at the locus of said second through hole;

f. said first wire being connected within said second housing component at an interior end of a first one of said three identical male prongs;

g. said second wire being connected within said second housing component at an interior end of a second one of said three identical male prongs;

h. said third wire being connected within said second housing component at an interior end of a third one of said three identical male prongs;

i. said first wire being also connected to a first one of three light emitting diodes located within and internally affixed to said first housing component at said end side thereof being open;

j. said second wire being also connected to a second one of said three light emitting diodes located within and internally affixed to said first housing component at said end side thereof being open;

k. said third wire being also connected to a third one of said three light emitting diodes located within and internally affixed to said first housing component at said end side thereof being open;

l. a fifth wire connecting said first one of said three light emitting diodes to one end of a first resistor within said first housing component;

m. a sixth wire connecting said second one of said three light emitting diodes to one end of a second resistor within said first housing component;

n. a seventh wire connecting said third one of said three light emitting diodes to one end of a third resistor within said first housing component;

o. a second end of said first resistor and a second end of said second resistor and a second end of said third resistor being connected to said fourth wire within said first housing component;

p. said fourth wire being further connected to a metallic base of said front female socket pocket within said second housing component;

q. said resistors being all characterized by resistivity of 1.0 kilohms, and;

r. said light emitting diodes being all characterized by optoelectric current carrying capacity of 10 milliamps.

5. An intravehicular auto harness integrity tester, comprising:

a. a first housing component with a first cable through hole in one side thereof with an end side thereof being closed and transparent;

b. coaxial cable carrying within it, a first wire, a second wire, a third wire and a fourth wire;

c. said coaxial cable connected to said first housing component at the locus of said first cable through hole;

d. a second housing component with three identical front male prongs affixed thereto and originating respectively from each of three through holes at a front side thereof and a front female socket pocket originating from said front side thereof and with a second cable through hole within a second side thereof;

e. said coaxial cable being connected to said second housing component at the locus of said second cable through hole;

f. said first wire being connected within said second housing component at an interior end of a first one of said three identical male prongs;

g. said second wire being connected within said second housing component at an interior end of a second one of said three identical male prongs;

h. said third wire being connected within said second housing component at an interior end of a third one of said three identical male prongs;

i. said first wire being also connected to a first resistor within said first housing component;

j. said second wire being also connected to a second resistor within said first housing k. said third wire being also connected to a third resistor within said first housing component;

l. said first resistor being connected via a fifth wire connected to a first light emitting diode located within and internally affixed to said first housing component at said end side thereof being closed and transparent;

m. said second resistor being connected via a sixth wire connected to a second light emitting diode located within and internally affixed to said first housing component at said end side thereof being closed and transparent;

n. said third resister being connected via an seventh wire connected to a third light emitting diode located within and internally affixed to said first housing component at said end side thereof being closed and transparent;

o. each of said diodes being connected to a first end of an off/on switch unit within said first housing component;

p. a second end of said off/on switch unit being connected to said fourth wire within said first housing component;

q. said fourth wire being connected within said second housing component to a metallic base of said front female socket pocket;

r. said resistors being all characterized by resistivity of 1.0 kilohms, and;

s. said light emitting diodes being all characterized by optoelectric current carrying capacity of 10 milliamps.

6. An intravehicular auto harness integrity tester, comprising:

a. a first housing component with a first cable through hole in one side thereof with an end side thereof being open;

b. coaxial cable carrying within it, a first wire, a second wire, a third wire and a fourth wire;

c. said coaxial cable connected to said first housing component at the locus of said first cable through hole;

d. a second housing component with three identical front male prongs affixed thereto and originating respectively from each of three through holes at a front side thereof and a front female socket pocket originating from said front side thereof and with a second cable through hole within a cable side thereof;

e. said coaxial cable being connected to said second housing component at the locus of said second cable through hole;

f. said first wire being connected within said second housing component at an interior end of a first one of said three identical male prongs;

g. said second wire being connected within said second housing component at an interior end of a second one of said three identical male prongs;

h. said third wire being connected within said second housing component at an interior end of a third one of said three identical male prongs;

i. said first wire being also connected to a first resistor within said first housing component;
j. said second wire being also connected to a second resistor within said first housing component;
k. said third wire being also connected to a third resistor within said first housing component;
l. said first resistor being connected via a fifth wire connected to a first light emitting diode located within and internally affixed to said first housing component at said end side thereof being open;
m. said second resistor being connected via a sixth wire connected to a second light emitting diode located within and internally affixed to said first housing component at said end side thereof being open;
n. said third resistor being connected via a seventh wire connected to a third light emitting diode located within and internally affixed to said first housing component at said end side thereof being open;
o. each of said diodes being connected to a first end of an off/on switch unit within said first housing component;
p. a second end of said off/on switch unit being connected to said fourth wire within said first housing component;
q. said fourth wire being connected within said second housing component to a metallic base of said front female socket pocket;
r. said resistors being all characterized by resistivity of 1.0 kilohms, and;
s. said light emitting diodes being all characterized by optoelectric current carrying capacity of 10 milliamps.

7. An intravehicular auto harness integrity tester, comprising:
a. a first housing component with a first cable through hole in one end side thereof with an opposite end side thereof being closed and transparent;
b. coaxial cable carrying within it, a first wire, a second wire, a third wire and a fourth wire;
c. said coaxial cable connected to said first housing component at the locus of said first cable through hole;
d. a second housing component with three identical front male prongs affixed thereto and originating respectively from each of three through holes at a front side thereof and a front female socket pocket originating from said front side thereof and with a second cable through hole within a second side thereof;
e. said coaxial cable being connected to said second housing component at the locus of said second cable through hole;
f. said first wire being connected within said second housing component at an interior end of a first one of said three identical male prongs;
g. said second wire being connected within said second housing component at an interior end of a second one of said three identical male prongs;
h. said third wire being connected within said second housing component at an interior end of a third one of said three identical male prongs;
i. said first wire being also connected to a first one of three light emitting diodes located within and internally affixed to said first housing component at said end side thereof being closed and transparent;
j. said second wire being also connected to a second one of said three light emitting diodes located within and internally affixed to said first housing component at said end side thereof being closed and transparent;
k. said third wire being also connected to a third one of said three light emitting diodes located within and internally affixed to said first housing component at said end side thereof being closed and transparent;
l. a fifth wire connecting said first one of said three light emitting diodes to one end of a first resistor within said first housing component;
m. a sixth wire connecting said second one of said three light emitting diodes to one end of a second resistor within said first housing component;
n. a seventh wire connecting said third one of said three light emitting diodes to one end of a third resistor within said first housing component;
o. a second end of said first resistor and a second end of said second resistor and a second end of said third resistor being connected to a first end of an off/on switch unit with said first housing component;
p. a second end of said off/on switch unit being connected to said fourth wire within said first housing component;
q. said fourth wire being further connected to a metallic base of said front female socket pocket within said second housing component;
r. said resistors being all characterized by resistivity of 1.0 kilohms, and;
s. said light emitting diodes being all characterized by optoelectric current carrying capacity of 10 milliamps.

8. An intravehicular auto harness integrity tester, comprising:
a. a first housing component with a first cable through hole in one side thereof with an end side thereof being open;
b. coaxial cable carrying within it, a first wire, a second wire, a third wire and a fourth wire;
c. said coaxial cable connected to said first housing component at the locus of said first cable through hole;
d. a second housing component with three identical front male prongs affixed thereto and originating respectively from each of three through holes at a front side thereof and a front female socket pocket originating from said front side thereof and with a second cable through hole within a second side thereof;
e. said coaxial cable being connected to said second housing component at the locus of said second through hole;
f. said first wire being connected within said second housing component at an interior end of a first one of said three identical male prongs;
g. said second wire being connected within said second housing component at an interior end of a second one of said three identical male prongs;
h. said third wire being connected within said second housing component at an interior end of a third one of said three identical male prongs;
i. said first wire being also connected to a first one of three light emitting diodes located within and internally affixed to said first housing component at said end side thereof being open;
j. said second wire being also connected to a second one of said three light emitting diodes located within and internally affixed to said first housing component at said end side thereof being open;
k. said third wire being also connected to a third one of said three light emitting diodes located within and internally affixed to said first housing component at said end side thereof being open;

l. a fifth wire connecting said first one of said three light emitting diodes to one end of a first resistor within said first housing component;

m. a sixth wire connecting said second one of said three light emitting diodes to one end of a second resistor within said first housing component;

n. a seventh wire connecting said third one of said three light emitting diodes to one end of a third resistor within said first housing component;

o. a second end of said first resistor and a second end of said second resistor and a second end of said third resistor being connected to a first end of an off/on switch unit with said first housing component;

p. a second end of said off/on switch unit being connected to said fourth wire within said first housing component;

q. said fourth wire being further connected to a metallic base of said front female socket pocket within said second housing component;

r. said resistors being all characterized by resistivity of 1.0 kilohms, and;

s. said light emitting diodes being all characterized by optoelectric current carrying capacity of 10 milliamps.

9. The intravehicular auto harness integrity tester of claim 1, whereby said resistors are characterized by resistivity within a range of 0.70 kilohms to 1.30 kilohms.

10. The intravehicular auto harness integrity tester of claim 2, whereby said resistors are characterized by resistivity within a range of 0.70 kilohms to 1.30 kilohms.

11. The intravehicular auto harness integrity tester of claim 3 whereby said resistors are characterized by resistivity within a range of 0.70 kilohms of 1.30 kilohms.

12. The intravehicular auto harness integrity tester of claim 4 whereby said resistors are characterized by resistivity within a range of 0.70 kilohms to 1.30 kilohms.

13. The intravehicular auto harness integrity tester of claim 5 whereby said resistors are characterized by resistivity within a range of 0.70 kilohms to 1.30 kilohms.

14. The intravehicular auto harness integrity tester of claim 6 whereby said resistors are characterized by resistivity within a range of 0.70 kilohms to 1.30 kilohms.

15. The intravehicular auto harness integrity tester of claim 7 whereby said resistors are characterized by resistivity within a range of 0.70 kilohms to 1.30 kilohms.

16. The intravehicular auto harness integrity tester of claim 8 whereby said resistors are characterized by resistivity within a range of 0.70 kilohms to 1.30 kilohms.

17. The intravehicular auto harness integrity tester of claim 1 whereby said first diode is one color, said second diode is another color different from the color of said first diode and said third diode is a third color different from said color of said first diode and said another color of said second diode.

18. The intravehicular auto harness integrity tester of claim 2 whereby said first diode is one color, said second diode is another color different from the color of said first diode and said third diode is a third color different from said color of said first diode and said another color of said second diode.

19. The intravehicular auto harness integrity tester of claim 3 whereby said first diode is one color, said second diode is another color different from the color of said first diode and said third diode is a third color different from said color of said first diode and said another color of said second diode.

20. The intravehicular auto harness integrity tester of claim 4 whereby said first diode is one color, said second diode is another color different from the color of said first diode and said third diode is a third color different from said color of said first diode and said another color of said second diode.

21. The intravehicular auto harness integrity tester of claim 5 whereby said first diode is one color, said second diode is another color different from the color of said first diode and said third diode is a third color different from said color of said first diode and said another color of said second diode.

22. The intravehicular auto harness integrity tester of claim 6 whereby said first diode is one color, said second diode is another color different from the color of said first diode and said third diode is a third color different from said color of said first diode and said another color of said second diode.

23. The intravehicular auto harness integrity tester of claim 7 whereby said first diode is one color, said second diode is another color different from the color of said first diode and said third diode is a third color different from said color of said first diode and said another color of said second diode.

24. The intravehicular auto harness integrity tester of claim 8 whereby said first diode is one color, said second diode is another color different from the color of said first diode and said third diode is a third color different from said color of said first diode and said another color of said second diode.

* * * * *